United States Patent
Lee et al.

(10) Patent No.: US 11,380,544 B2
(45) Date of Patent: Jul. 5, 2022

(54) LASER ANNEALING DEVICE AND THIN FILM CRYSTALLIZATION AND DEHYDROGENATION METHOD USING SAME

(71) Applicant: Samsung Display Co., Ltd., Yongin-si (KR)

(72) Inventors: Dong-Min Lee, Yongin-si (KR); Ji-Hwan Kim, Hwaseong-si (KR); Jongoh Seo, Seoul (KR); Byung Soo So, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/997,454

(22) Filed: Aug. 19, 2020

(65) Prior Publication Data

US 2021/0057218 A1    Feb. 25, 2021

(30) Foreign Application Priority Data

Aug. 19, 2019 (KR) .......................... 10-2019-0101145

(51) Int. Cl.
*H01L 21/02* (2006.01)
*H01L 21/67* (2006.01)
*H01L 21/268* (2006.01)

(52) U.S. Cl.
CPC .. *H01L 21/02675* (2013.01); *H01L 21/02107* (2013.01); *H01L 21/268* (2013.01); *H01L 21/67115* (2013.01)

(58) Field of Classification Search
CPC ......... H01L 21/02675; H01L 21/67115; H01L 21/268; H01L 21/02107

USPC ....................................................... 438/778
See application file for complete search history.

(56) References Cited

U.S. PATENT DOCUMENTS

| | | | |
|---|---|---|---|
| 5,930,606 A | 7/1999 | McCulloch | |
| 6,136,632 A | 10/2000 | Higashi | |
| 7,011,577 B2 | 3/2006 | Lee | |
| 7,391,928 B2 | 6/2008 | Takayama et al. | |
| 7,919,399 B2 | 4/2011 | Arai | |
| 9,293,567 B2 * | 3/2016 | Kim | ................. H01L 29/66757 |
| 2007/0013791 A1 | 1/2007 | Kinoshita et al. | |

FOREIGN PATENT DOCUMENTS

| | | |
|---|---|---|
| JP | 2017-139487 A | 8/2017 |
| KR | 1998-701267 A | 5/1998 |
| KR | 10-2001-0039813 A | 5/2001 |
| KR | 10-2004-0106240 A | 12/2004 |
| KR | 10-1528346 B1 | 6/2015 |
| KR | 10-2016-0116242 A | 10/2016 |

* cited by examiner

*Primary Examiner* — Quoc D Hoang
(74) *Attorney, Agent, or Firm* — Lewis Roca Rothgerber Christie LLP

(57) ABSTRACT

A laser annealing device includes a stage, a laser generator, and a reflective member. The stage supports a substrate with a thin film formed thereon to be processed, and may be moved in a first direction at a set or predetermined speed. The laser generator irradiates a first area of the thin film with a laser beam while the stage is moved. The reflective member reflects a part of the laser beam, which is reflected from the first area of the thin film, to a second area of the thin film. The first area and the second area are spaced apart from each other.

18 Claims, 5 Drawing Sheets

LASER ANNEALING DEVICE AND THIN
FILM CRYSTALLIZATION AND
DEHYDROGENATION METHOD USING
SAME

CROSS-REFERENCE TO RELATED APPLICATION

This application claims priority to and the benefit of Korean Patent Application No. 10-2019-0101145, filed on Aug. 19, 2019 in the Korean Intellectual Property Office (KIPO), the entire content of which is incorporated herein by reference.

BACKGROUND

1. Field

One or more aspects of embodiments of the present disclosure relate to a laser annealing device and a thin film crystallization method using the same. One or more aspects of embodiments of the present disclosure relate to a laser annealing device using an incident beam and a re-incident beam, and a thin film crystallization method using the same.

2. Description of the Related Art

In the manufacturing process of organic light emitting display devices in the related art, a dehydrogenation process and an excimer laser annealing (ELA) process may be performed. The dehydrogenation process may be performed to lower the hydrogen content of thin films, and the ELA process may be performed to crystallize the thin film (for example, when the thin film is an amorphous silicon layer), where the ELA process may be performed after the dehydrogenation process is performed.

For example, an organic light emitting diode display in the related art may include a semiconductor element, and an active layer included in the semiconductor element may include an amorphous silicon layer. The active layer may include or contain hydrogen (e.g., hydrogen atoms). As described above, the content of hydrogen contained in the active layer may be lowered through the dehydrogenation process. For example, the hydrogen contained in the amorphous silicon layer may partially escape to the outside (e.g., may be removed) through the dehydrogenation process. The ELA process may be performed after the dehydrogenation process. The amorphous silicon layer may then be crystallized into a poly silicon layer through the ELA process. However, hydrogen contained in insulating layers (for example, buffer layers) formed below the active layer may not escape to the outside during the dehydrogenation process, and may move into the active layer in the ELA process (for example, because they may be positioned adjacent to a bottom surface of the active layer). In this case, a film burst may occur on a surface of the active layer, and a defect of the semiconductor element may be caused.

SUMMARY

One or more aspects of embodiments of the present disclosure are directed toward a laser annealing device.

One or more aspects of embodiments of the present disclosure are directed toward a thin film crystallization method using a laser annealing device.

One or more example embodiments of the present disclosure provide a laser annealing device including a stage, a laser generator, and a reflective member. The stage supports a substrate with a thin film to be processed formed thereon, and is to be moved in a first direction at a set or predetermined speed. The laser generator irradiates a first area of the thin film with a laser beam while the stage is moved. The reflective member reflects a part of the laser beam, which is reflected from the first area of the thin film, to a second area of the thin film. The first area and the second area are spaced apart from each other.

In some embodiments, a reflection angle of the reflective member may be determined or selected such that the first area and the second area are spaced apart from each other (e.g., by a suitable distance D).

In some embodiments, the first area and the second area are spaced apart from each other by a set or predetermined distance D in a second direction opposite to the first direction (e.g., by a set or predetermined distance D along the first direction).

In some embodiments, a part of the laser beam emitted from the laser generator may be absorbed in the first area, and a remainder of the laser beam may be reflected from the first area and then incident to the reflective member.

In some embodiments, the laser beam irradiated to the first area may have a higher energy than the laser beam irradiated to the second area.

In some embodiments, the laser beam irradiated to the first area may be an incident beam, and the laser beam reflected from the first area among the incident beam may be a reflected beam. A laser beam reflected from the reflective member in the reflected beam and irradiated to the second area may be a re-incident beam.

In some embodiments, a distance (spaced distance) between the incident beam and the re-incident beam on the thin film may be determined by the following expression:

$$D > vt \qquad \text{Expression}$$

wherein D is a distance between an incident beam and the re-incident beam, v is set or predetermined speed of the stage, and t is a time in which a temperature of the thin film recovers to room temperature after being irradiated by the re-incident beam).

In some embodiments, a reflection angle of the reflective member may be determined according to the distance D between the incident beam and the re-incident beam on the thin film.

In some embodiments, a crystallization process may be performed on the thin film through the incident beam, and a dehydrogenation process may be performed on the thin film through the re-incident beam.

In some embodiments, the incident beam may be irradiated at an angle smaller than 90 degrees with respect to a top surface of the stage, and the re-incident beam may be irradiated at an angle greater than 90 degrees with respect to the top surface of the stage.

In some embodiments, the incident beam and the re-incident beam may intersect or cross each other.

In some embodiments, while the stage is moved and after the dehydrogenation process is performed on the thin film, the crystallization process may be performed.

In some embodiments, the laser annealing device may further include at least one insulating layer disposed between the substrate and the thin film.

One or more example embodiments of the present disclosure provide a thin film crystallization method using a laser annealing device, as follows. A substrate with a thin film to be processed formed thereon is positioned on a stage. The stage moves in a first direction at a set or predetermined speed. A laser beam is irradiated in a first area of the thin film. A part of the laser beam, which is reflected from the first area of the thin film, is reflected to a second area of the thin film. While the stage is moved, a crystallization process is performed through the laser beam irradiated to the first area after a dehydrogenation process is performed through the part of the laser beam irradiated to the second area.

In some embodiments, the first area and the second area may be spaced apart from each other, and the second area may be spaced apart from the first area in a second direction opposite to the first direction.

In some embodiments, the laser beam irradiated to the first area may be defined as an incident beam, and laser beam reflected from the first area may be defined as a reflected beam. A laser beam reflected from the reflective member and irradiated to the second area may be defined as a re-incident beam. The incident beam may be irradiated at an angle smaller than 90 degrees with respect to a top surface of the stage, and the re-incident beam may be irradiated at an angle greater than 90 degrees with respect to the top surface of the stage. The incident beam and the re-incident beam may intersect or cross each other.

In some embodiments, a crystallization process may be performed on the thin film through the incident beam, and a dehydrogenation process may be performed on the thin film through the re-incident beam.

In some embodiments, a part of the laser beam may be absorbed in the first area, and a remainder of the laser beam may be reflected from the first area.

In some embodiments, the laser beam irradiated to the first area may be higher in energy than the laser beam irradiated to the second area.

In some embodiments, the method may further include forming at least one insulating layer between the substrate and the thin film. The insulating layer may include silicon oxide, silicon nitride, silicon oxynitride, silicon oxycarbide, silicon carbonitride, aluminum oxide, aluminum nitride, tantalum oxide, hafnium oxide, zirconium oxide, and/or titanium oxide, and the thin film may include an amorphous silicon layer.

One or more example embodiments of the present disclosure provide a laser annealing device that may irradiate the first area with the incident beam, and may irradiate the second area with the re-incident beam. The second area may be spaced apart from the first area by the set or predetermined distance in the second direction. While the stage is moving in the first direction at the set or predetermined speed, the dehydrogenation process may be performed on the first portion of the amorphous silicon layer through the re-incident beam, and then the crystallization process may be performed on the first portion through the incident beam. In other words, after the re-incident beam is irradiated to the first portion of the amorphous silicon layer, the stage may move in the first direction by the set or predetermined distance, and thus the incident beam may be irradiated onto the first portion after the first portion has recovered to room temperature. In this case, film burst may not occur in the first portion, and the first portion may be crystallized.

In the thin film crystallization method of the laser annealing device according to example embodiments of the present disclosure, hydrogen contained in the amorphous silicon layer may be discharged to the outside through the first dehydrogenation process, and hydrogen contained in the buffer layer may be diffused into the amorphous silicon layer in the first dehydrogenation process. After the first dehydrogenation process is performed, and while the stage moves in the first direction at the set or predetermined speed, the second dehydrogenation process may be performed on the first portion of the amorphous silicon layer through the re-incident beam, and then the crystallization process may be performed on the first portion through the incident beam. For example, the re-incident beam may partially discharge the diffused hydrogen to the outside of the amorphous silicon layer through the second dehydrogenation process, and the hydrogen content contained in the amorphous silicon layer may be lowered below a set or predetermined level. After the re-incident beam is irradiated to the first portion of the amorphous silicon layer, the stage may move in the first direction by the set or predetermined distance, and thus the incident beam may be irradiated onto the first portion after the first portion recovers to room temperature. In this case, film burst may not occur in the first portion, and the first portion may be crystallized. Accordingly, after the second dehydrogenation process is performed on the amorphous silicon layer, the crystallization process is performed, so that the amorphous silicon layer may be changed into a poly silicon layer without film burst.

BRIEF DESCRIPTION OF THE DRAWINGS

Example embodiments of the present disclosure will be understood in more detail from the following description, taken in conjunction with the accompanying drawings, in which.

DETAILED DESCRIPTION

Figure 1:
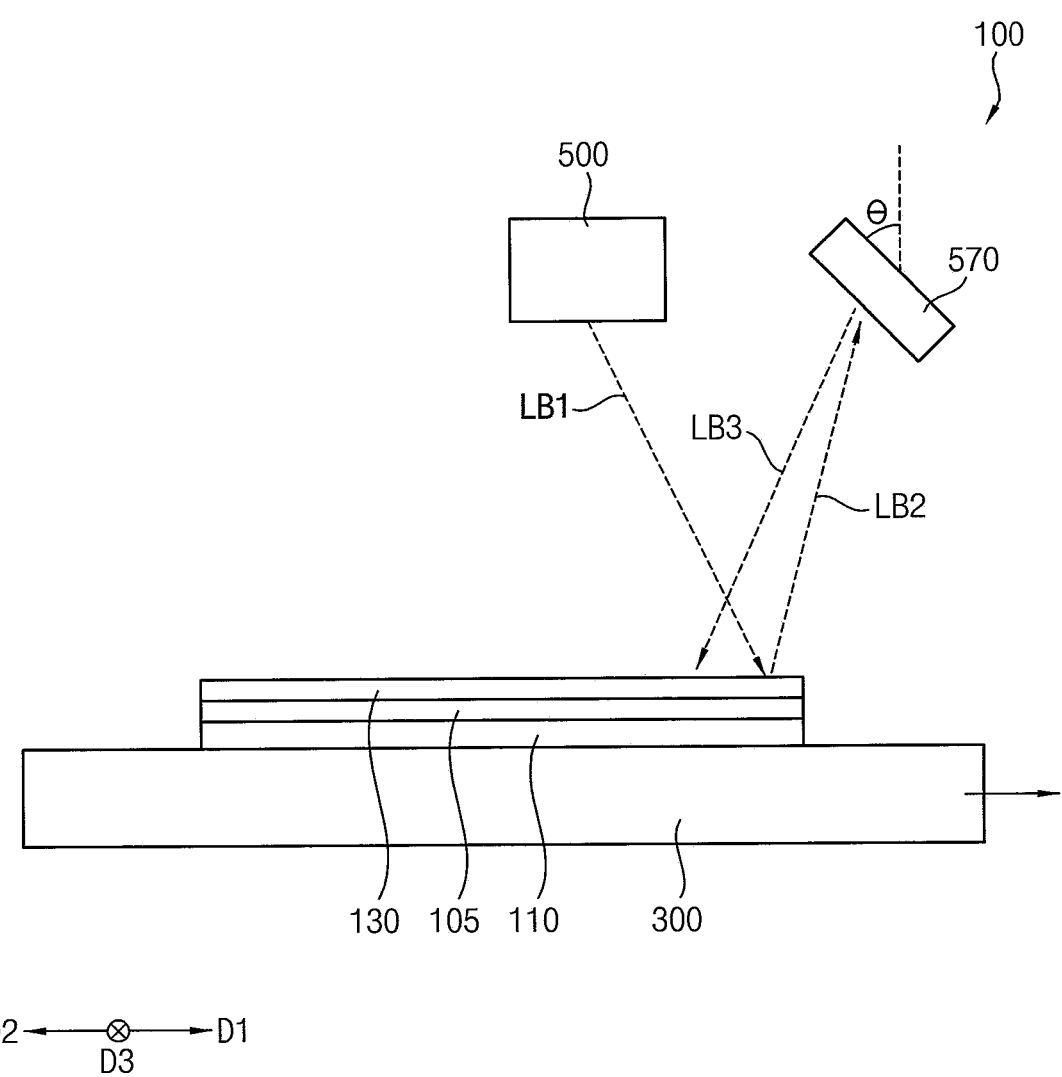
FIG. 1 is a block diagram showing a laser annealing device according to example embodiments of the present disclosure.

Hereinafter, a laser annealing device and a thin film crystallization method using a laser annealing device according to example embodiments of the present disclosure will be described in more detail with reference to the accompanying drawings. In the accompanying drawings, the same or similar reference numerals refer to the same or similar elements, and duplicative descriptions thereof may not be provided.

Figure 2:
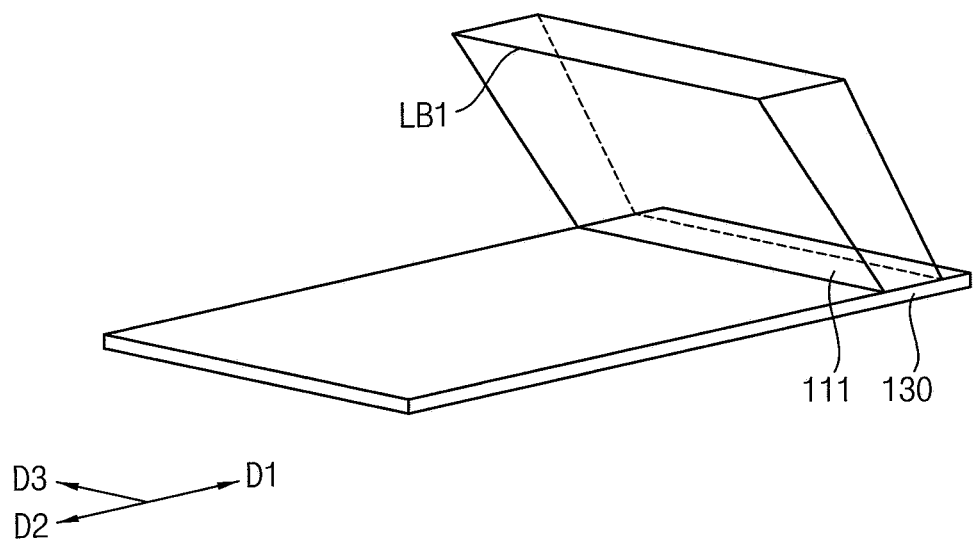
FIG. 2 is a perspective view illustrating a state in which an incident beam of FIG. 1 is irradiated onto a thin film to be processed.
Figure 3:
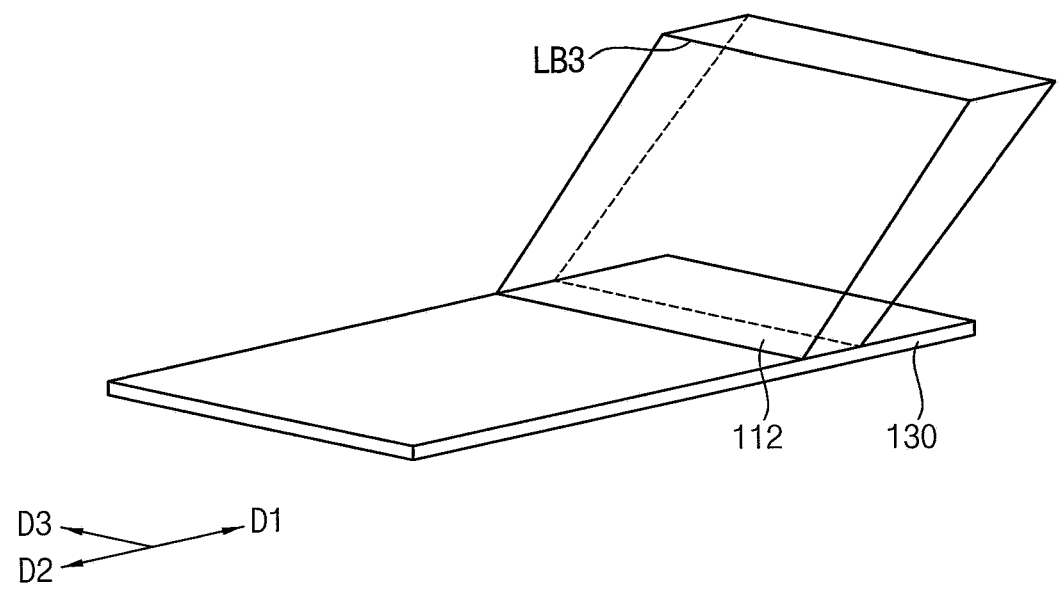
FIG. 3 is a perspective view illustrating a state in which a re-incident beam of FIG. 1 is irradiated onto the thin film to be processed.
Figure 4:
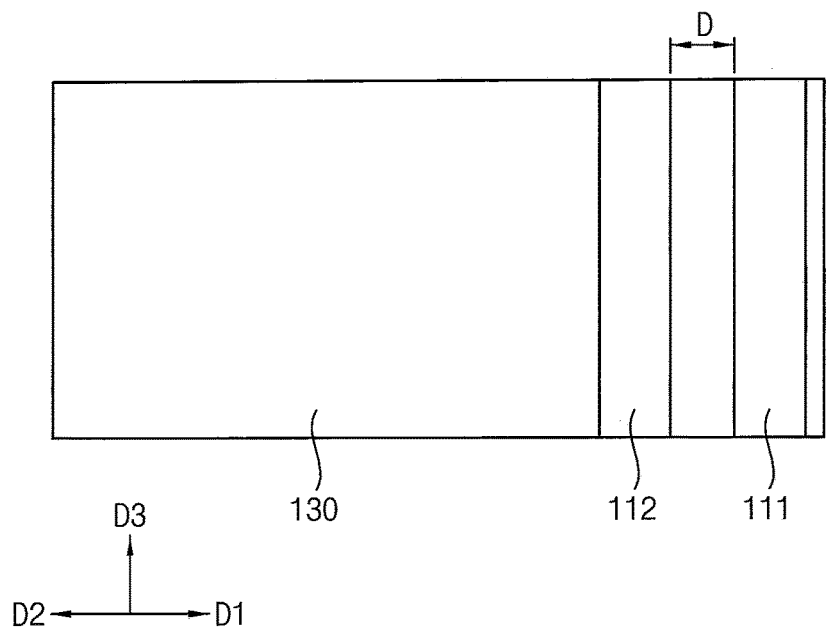
FIG. 4 is a plan view highlighting the areas that are irradiated in the thin film to be processed of FIG. 1 by the incident beam and the re-incident beam.
Figure 5:
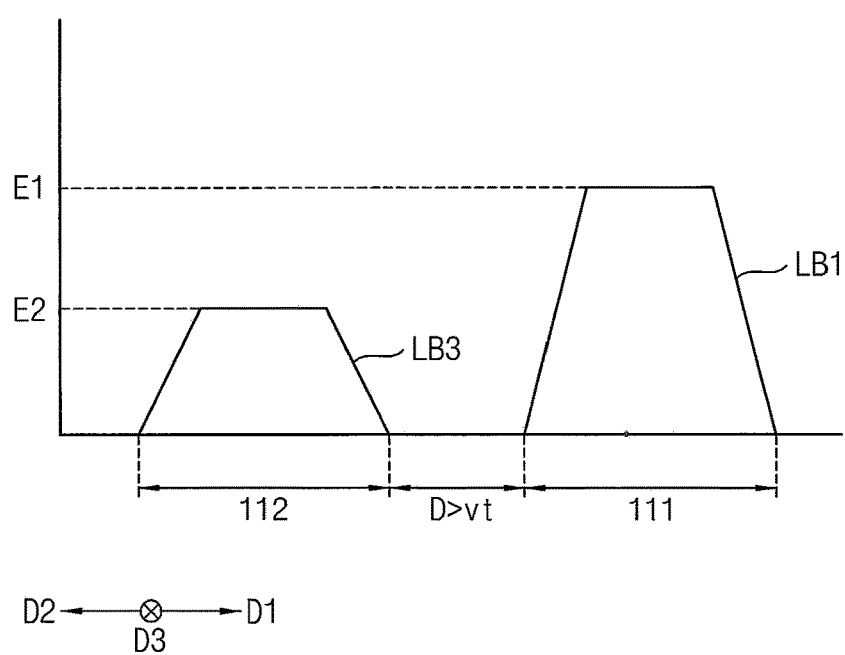
FIG. 5 is a graphical side view illustrating profiles of the incident beam and the re-incident beam in the thin film to be processed of FIG. 1.

FIG. 1 is a block diagram showing a laser annealing device according to example embodiments of the present disclosure. FIG. 2 is a perspective view illustrating a state in which an incident beam of FIG. 1 is irradiated onto a thin film to be processed. FIG. 3 is a perspective view illustrating a state in which a re-incident beam of FIG. 1 is irradiated onto the thin film to be processed. FIG. 4 is a plan view highlighting the areas that are irradiated in the thin film to be processed of FIG. 1 by the incident beam and the re-incident beam. FIG. 5 is a graphical side view illustrating profiles of the incident beam and the re-incident beam in the thin film to be processed of FIG. 1. For example, FIG. 1 may correspond to a side view of the laser annealing device. In FIG. 5, the horizontal axis represents a width of a laser beam, and the vertical axis represents energy of the laser beam.

Referring to FIGS. 1, 2, 3, and 4, the laser annealing device 100 may include a laser generator 500, a stage 300, a reflective member 570, and/or the like.

A substrate 110 including a glass substrate and/or a plastic substrate may be disposed on the stage 300, and a buffer layer 105 (for example, an insulating layer) may be formed on the substrate 110. An amorphous silicon layer 130 (for example, a thin film to be processed) may be formed on the buffer layer 105. The stage 300 may support the substrate 110 on which the amorphous silicon layer 130 and the buffer layer 105 are formed, and may move in (along) a first direction D1 at a set or predetermined speed. For example, the set or predetermined speed of the stage 300 may be approximately (or about) $8.75 \times 10^{-3}$ m/s. The first direction D1 may be a direction parallel to a top surface of the stage 300.

The buffer layer 105 may have a structure formed of a single layer, or may be laminated with at least two insulating layers. For example, the buffer layer 105 may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), and/or the like.

The laser generator 500 may be disposed on the amorphous silicon layer 130. The laser generator 500 may be to generate a laser beam, and may emit the laser beam to (e.g., at or onto) the amorphous silicon layer 130 while the stage 300 is moving. The laser generator 500 may have a fixed angle with respect to the top surface of the amorphous silicon layer 130. In some embodiments, the laser beam may be irradiated to a first area 111 of the amorphous silicon layer 130. The laser generator 500 may generate a gas laser. For example, the laser generator 500 may include or be a XeCl excimer laser.

As shown in FIGS. 1 and 4, in some embodiments, a part (portion) of the laser beam emitted from the laser generator 500 may be absorbed in the first area 111, and the remainder (e.g., the non-absorbed portion) of the laser beam may be reflected from the first area 111 and then incident to a reflective member 570. The laser beam emitted from the laser generator 500 and irradiated to the first area 111 of the amorphous silicon layer 130 is defined as an incident beam LB1. The laser beam reflected from the first area 111 of the amorphous silicon layer 130 and incident to the reflective member 570 is defined as a reflective beam LB2. The laser beam reflected from the reflective member 570 and irradiated to a second area 112 of the amorphous silicon layer 130 is defined as a re-incident beam LB3. As shown in FIG. 4, the second area 112 may be spaced apart from the first area 111 by a set or predetermined distance (for example, a set or predetermined distance D) in a second direction D2 opposite to the first direction D1. For example, the first area 111 and the second area 112 may be spaced apart by the set or predetermined distance D in the first direction D1. Further, the laser annealing device 100 may perform the dehydrogenation process on the amorphous silicon layer 130 using the re-incident beam LB3, and may perform the crystallization process using the incident beam LB1. For example, the dehydrogenation process may be performed onto the amorphous silicon layer 130, and then the crystallization process may be performed, while the stage 300 moves (e.g., in the direction D1). As used herein, the terms "first area 111" and "second area 112" may correspond to the beam areas of the incident beam LB1 and the re-incident beam LB3, respectively, or for example, to the exposure areas of those beams. In some embodiments, for example, the "first area 111" and "second area 112" may not refer to fixed regions of the amorphous silicon layer 130, but rather, to portions of the amorphous silicon layer 130 that are exposed to the beams in shifting sequence as the underlying stage 300 moves in the first direction D1.

The reflective member 570 may be disposed in an advancing direction of the reflective beam LB2. For example, the reflective member 570 may be positioned so as to further reflect the laser beam that is reflected from the first area 111 of the amorphous silicon layer 130 (for example, the reflective beam LB2), to the second area 112 of the amorphous silicon layer 130. The reflective member 570 may have a fixed angle with respect to a top surface of the amorphous silicon layer 130. For example, as shown in FIG. 1, the reflective member 570 may be positioned above and further along the direction D1 relative to an initial position of the stage 300 (e.g., prior to movement of the stage 300), and the reflective member 570 may be angled to generally face the top surface of the amorphous silicon layer 130, (e.g., prior to movement of the stage 300).

In example embodiments, the reflective member 570 may reflect substantially all the reflective beam LB2, which is reflected from the first area 111 of the amorphous silicon layer 130 and is incident to the reflective member 570, at a set or predetermined angle (for example, a reflection angle θ of the reflective member 570), and the re-incident beam LB3 reflected from the reflective member 570 may be irradiated to the second area 112 of the amorphous silicon layer 130. In some embodiments, the reflection angle θ of the reflective member 570 may be determined or selected such that the second area 112 may be spaced apart (e.g., separated) from the first area 111. In other words, a position and/or separation of the second area 112 (e.g., relative to the first area 111) may be determined or selected according to the reflection angle θ of the reflective member 570.

The reflective member 570 may include a material capable of reflecting a laser beam, such as a metal, an alloy, or a mirror. For example, the reflective member 570 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an alloy containing aluminum, aluminum nitride (AlN), an alloy containing silver, tungsten nitride (WN), an alloy containing copper, an alloy containing molybdenum, titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), and/or the like.

As shown in FIG. 2, the incident beam LB1 may be irradiated to the first area 111 of the amorphous silicon layer 130 while the stage 300 moves at a set or predetermined speed. The incident beam LB1 may be irradiated at an angle smaller than 90 degrees with respect to the top surface of the stage 300 (e.g., the angle between a first vector bisecting the incident beam LB1 with respect to the first direction D1, and a second vector starting at the point at which the first vector hits the top surface of the amorphous silicon layer 130 and extends along the second direction D2 is less than 90 degrees), and may be irradiated in a form of a line having a set or constant width (for example, a width in the first direction D1) and length (for example, a length in a third direction D3 orthogonal to the first and second directions D1 and D2).

Although FIG. 2 shows that the incident beam LB1 has a shape of being condensed (e.g., a converging beam shape), the configuration of the present disclosure is not limited thereto. In some embodiments, for example, the incident beam LB1 may have a diverging shape or a parallel shape.

As shown in FIG. 3, the re-incident beam LB3 may be irradiated to the second area 112 of the amorphous silicon layer 130 while the stage 300 moves at the set or predetermined speed. The re-incident beam LB3 may be irradiated at an angle greater than 90 degrees with respect to the top surface of the stage 300 (e.g., the angle between a third vector bisecting the re-incident beam LB3 with respect to the first direction D1, and the second vector is greater than 90 degrees), and the incident beam LB1 and the re-incident beam LB3 may intersect or cross each other. In some embodiments, the re-incident beam LB3 may be irradiated in a form of a line having a constant width (for example, the width in the first direction D1) and length (for example, the length in the third direction D3). Further, an incident angle of the re-incident beam LB3 may be adjusted or selected by the reflection angle θ of the reflective member 570. By adjusting the reflection angle θ of the reflective member 570, the second area 112 to which the re-incident beam LB3 is irradiated in the second direction D2 may be spaced apart from the first area 111 to which the incident beam LB1 is irradiated on the amorphous silicon layer 130.

Although FIG. 3 shows that the re-incident beam LB3 has a shape of being condensed (e.g., a converging beam shape), the configuration of the present disclosure is not limited thereto. For example, the re-incident beam LB3 may have a diverging shape or a parallel shape.

As shown in FIG. 5, a sectional profile of each of the incident beam LB1 and the re-incident beam LB3 may have a symmetrical shape on both (e.g., simultaneous) sides of each beam with respect to a central axis of a direction in which the laser beam is irradiated (e.g., with respect to a central axis normal to the surface of the amorphous silicon layer 130). In some embodiments, the incident beam LB1 may have a first energy E1, and the re-incident beam LB3 may have a second energy E2, where the first energy E1 may be greater than the second energy E2. The first energy E1 may correspond to an energy level capable of (suitable for) changing the amorphous silicon layer 130 into a poly silicon layer, and the second energy E2 may correspond to an energy level capable of reducing the content of hydrogen contained in the amorphous silicon layer 130. For example, the first energy E1 may have a relatively high energy level so as to be used in the crystallization process, and the second energy E2 may have a relatively low energy level so as to be used in the dehydrogenation process. In some embodiments, the incident beam LB1 may be spaced apart from the re-incident beam LB3 by the set or predetermined distance D.

Although FIG. 5 shows that the sectional profile of each of the incident beam LB1 and the re-incident beam LB3 has a symmetrical shape on both (e.g., simultaneous) sides thereof with respect to the central axis of the direction in which the laser beam is irradiated, the configuration of the present disclosure is not limited thereto. For example, the sectional profile of each of the incident beam LB1 and the re-incident beam LB3 may have an asymmetrical shape (e.g., a shape or slope that differs between sides) with respect to the central axis of the direction in which the laser beam is irradiated.

Referring back to FIGS. 1 to 5, the set or predetermined distance D (for example, the distance in which the second area 112 is spaced apart from the first area 111) may be determined by the following Expression:

$$D > vt \qquad \text{Expression}$$

wherein D is a spaced interval (for example, the set or predetermined distance D) between adjacent or proximate sides of the incident beam LB1 and the re-incident beam LB3, v is a speed of stage 300, and t is a time in which a temperature of the amorphous silicon layer 130 recovers to room temperature after being irradiated by the re-incident beam LB3.

In some embodiments of the present disclosure, v may be approximately (or about) $8.75 \times 10^{-3}$ m/s, and t may be approximately (or about) $10^{-2}$ s. Accordingly, in some embodiments, D may be approximately (or about) 87.5 um. In other words, the second area 112 may be spaced apart from the first area 111 by 87.5 um in the second direction D2, and the reflection angle θ of the reflective member 570 may be determined or selected based on a desired value of D. However, embodiments of the present disclosure are not limited thereto, and the variables v, t, and D may be varied as long as they fulfill the Expression.

For example, in the manufacturing process of a related art organic light emitting display device, the dehydrogenation process and the ELA process may be performed. The dehydrogenation process may be performed to lower the content of hydrogen present in the amorphous silicon layer, and the ELA process may crystallize the amorphous silicon layer, such that the ELA process may be performed after the dehydrogenation process is performed.

The related art organic light emitting diode display may include a semiconductor element, and an active layer included in the semiconductor element may include an amorphous silicon layer. The amorphous silicon layer may include hydrogen. As described above, the content of hydrogen contained in the amorphous silicon layer may be lowered through the dehydrogenation process. For example, a portion of the hydrogen contained in the amorphous silicon layer may escape or be released to the outside (e.g., the environment) through (as a result of) the dehydrogenation process. After the dehydrogenation process, the ELA process may be performed. The amorphous silicon layer may be crystallized into a poly silicon layer through the ELA process. However, hydrogen contained in insulating layers (for example, buffer layers) formed below the amorphous silicon layer may not escape to the outside in the dehydrogenation process, and may diffuse into the amorphous silicon layer. In this case, a film burst may occur on a surface of the active layer during the ELA process as a result of the raised hydrogen content, and a defect of the semiconductor element may be caused. Further, when insulating layers are not formed below the amorphous silicon layer, but the content of hydrogen in the amorphous silicon layer is about 3% or more, the content of hydrogen contained in the amorphous silicon layer cannot be lowered below a set or predetermined level through the dehydrogenation process, and thus a film burst may occur on the surface of the amorphous silicon layer during the ELA process.

In addition, when the second area 112 is not spaced apart from the first area 111 by the set or predetermined distance D, a film burst may occur on the amorphous silicon layer 130. For example, when the spaced distance from (between)

the first area 111 to (and) the second area 112 is smaller than the set or predetermined distance D, as the stage 300 moves in the first direction D1 after the re-incident beam LB3 is irradiated to a first portion of the amorphous silicon layer 130 (e.g., when the first portion is within the second area 112), the incident beam LB1 may be irradiated onto the first portion (e.g., when the first portion is within the first area 111) before a temperature of the first portion recovers to room temperature. In this case, a film burst may occur within the first portion.

The laser annealing device 100 according to example embodiments of the present disclosure may irradiate the first area 111 with the incident beam LB1, and may irradiate the second area 112 with the re-incident beam LB3. The second area 112 may be spaced apart from the first area 111 by the set or predetermined distance D in the second direction D2. While the stage 300 is moving in the first direction D1 at the set or predetermined speed, the dehydrogenation process may be performed on the first portion of the amorphous silicon layer 130 through the re-incident beam LB3 and then the crystallization process may be subsequently performed on the first portion through the incident beam LB1. In other words, after the re-incident beam LB3 is irradiated to the first portion of the amorphous silicon layer 130, the stage 300 may move in the first direction D1 by the set or predetermined distance D, and thus the incident beam LB1 may be subsequently irradiated onto the first portion after the temperature of the first portion has recovered to room temperature. In this case, a film burst may not occur in the first portion, and the first portion may be suitably crystallized.

For example, because the stage 300 moves in the first direction D1, the crystallization process may be performed by the incident beam LB1 after a set or predetermined time in the second area 112 where the dehydrogenation process was previously performed by the re-incident beam LB3 (e.g., in the portion positioned within the second area 112, which was previously positioned within the first area 111). As described above, the buffer layer 105 may be disposed below the amorphous silicon layer 130, and the dehydrogenation process may be performed through the re-incident beam LB3 having a relatively low energy with respect to hydrogen in the buffer layer 105 diffused into the amorphous silicon layer 130, so that film burst due to hydrogen in the buffer layer 105 can be prevented or reduced.

Figure 6:
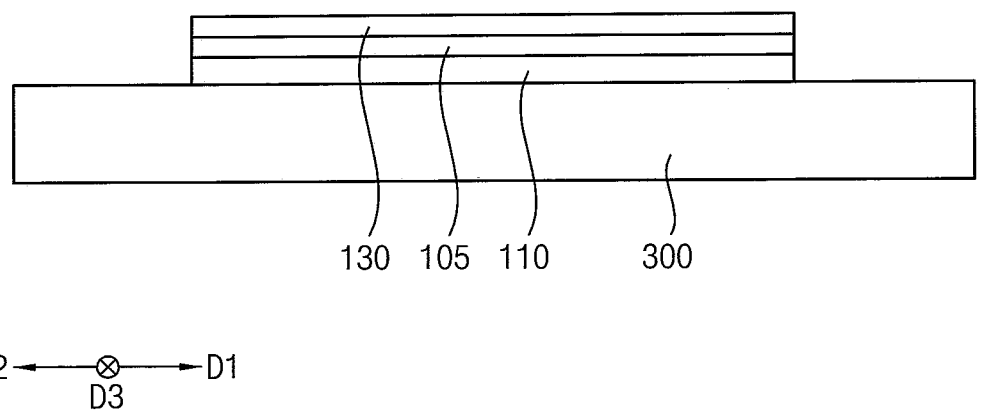
FIGS. 6 to 8 are views showing a thin film crystallization method using the laser annealing device according to example embodiments of the present disclosure.
Figure 7:
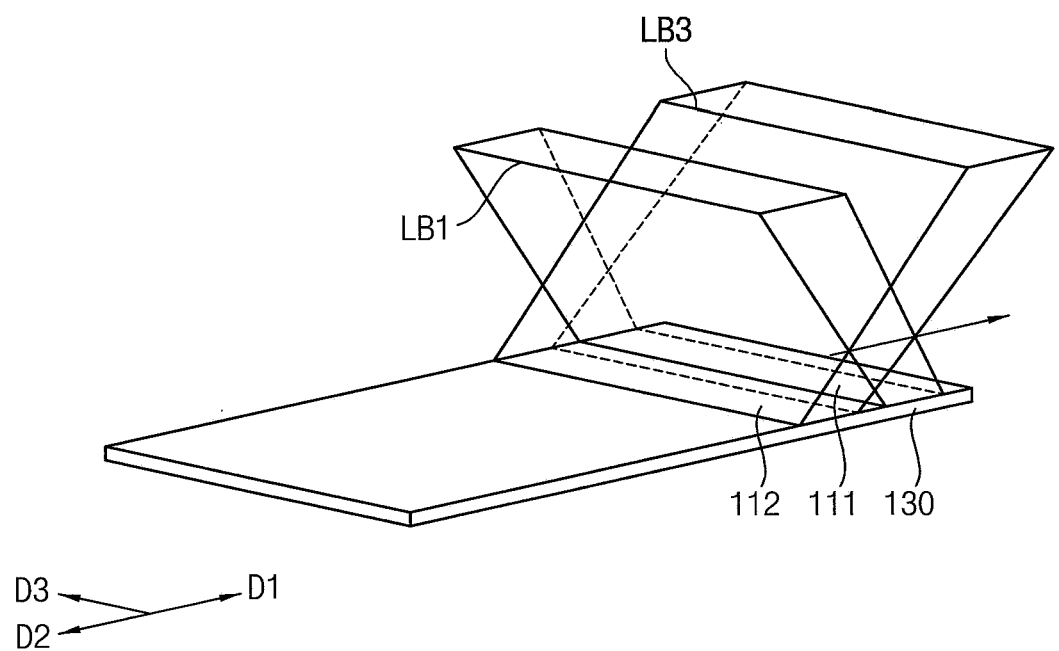
Figure 8:
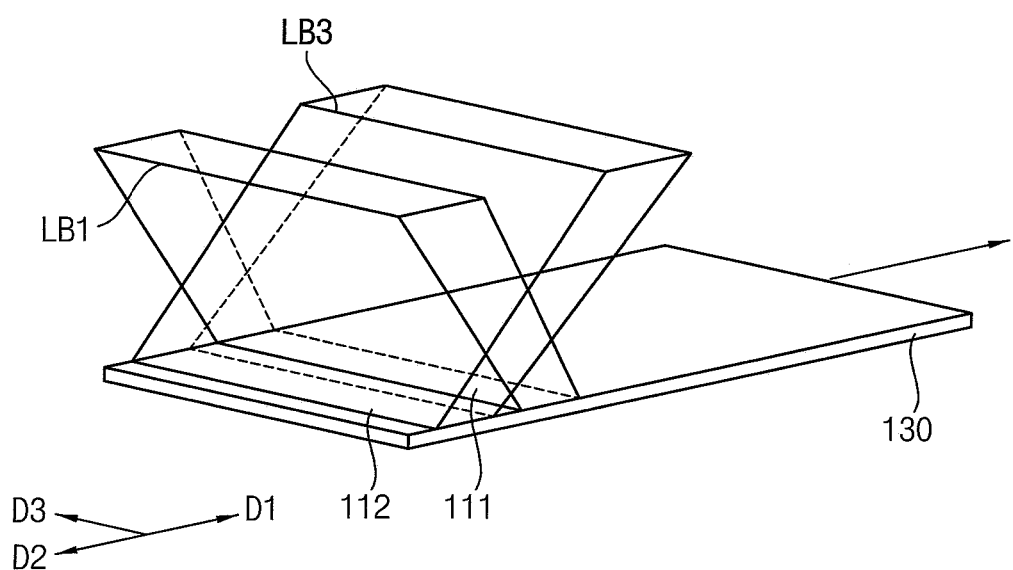

FIGS. 6 to 8 are views showing a thin film crystallization method using the laser annealing device according to example embodiments of the present disclosure. For example, FIG. 6 corresponds to a side view of the laser annealing device, and FIGS. 7 and 8 are perspective views showing a state in which the incident beam LB1 and the re-incident beam LB3 are irradiated to a film to be processed.

Referring to FIG. 6, in the thin film crystallization method according to embodiments of the present disclosure, the stage 300 may be provided. The substrate 110 may be formed on the stage 300. The substrate 110 may be formed using a glass substrate and/or a plastic substrate.

A buffer layer 105 (for example, an insulating layer) may be formed on the substrate 110. The buffer layer 105 may have a structure formed of a single layer or a structure formed for at least two insulating layers laminated together. For example, the buffer layer 105 may be formed using SiO, SiN, SiON, SiOC, SiCN, AlO, AlN, TaO, HfO, ZrO, TiO, and/or the like.

An amorphous silicon layer 130 (for example, a thin film to be processed) may be formed on the buffer layer 105. Accordingly, the substrate 110 on which the amorphous silicon layer 130 and the buffer layer 105 are formed may be positioned on the stage 300, and the stage 300 may support the substrate 110 on which the amorphous silicon layer 130 and the buffer layer 105 are formed.

After the stage 300 is positioned, a first dehydrogenation process may be performed (e.g., across the entire surface of the amorphous silicon layer 130). The hydrogens contained in the amorphous silicon layer 130 may partially escape to the outside through the first dehydrogenation process, and the content of hydrogen contained in the amorphous silicon layer 130 may thereby be reduced. However, hydrogen contained in the buffer layer 105 cannot escape to the outside in the first dehydrogenation process, and may be diffused into the amorphous silicon layer 130. For example, the content of hydrogen contained in the amorphous silicon layer 130 may not be lowered below a set or predetermined level through the first dehydrogenation process.

Referring to FIGS. 1, 7, and 8, the stage 300 may move in the first direction D1 at a set or predetermined speed. For example, the set or predetermined speed of the stage 300 may be approximately (or about) $8.75 \times 10^{-3}$ m/s. The first direction D1 may be a direction parallel to a top surface of the stage 300.

The laser generator 500 may be positioned above the amorphous silicon layer 130. The laser generator 500 may generate a laser beam, and may emit the laser beam to the amorphous silicon layer 130 while the stage 300 is moving. The laser generator 500 may have a fixed angle with respect to the top surface of the amorphous silicon layer 130. In some embodiments, the laser beam may be irradiated to the first area 111 of the amorphous silicon layer 130. The laser generator 500 may generate a gas laser. For example, the laser generator 500 may include a XeCl excimer laser.

A part or portion of the laser beam emitted from the laser generator 500 may be absorbed in the first area 111, and the remainder (e.g., non-absorbed portion) of the laser beam may be reflected from the first area 111 and then incident to a reflective member 570. The reflective member 570 may be positioned in an advancing direction of the laser beam reflected from the first area 111. For example, the reflective member 570 may be positioned so as to reflect the part of the laser beam that is reflected from the first area 111 of the amorphous silicon layer 130, to the second area 112 of the amorphous silicon layer 130. For example, the reflective member 570 may have a fixed angle with respect to a top surface of the amorphous silicon layer 130.

In some embodiments, the reflective member 570 may reflect all of the part of the laser beam that is reflected from the first area 111 of the amorphous silicon layer 130 and incident to the reflective member 570, at a set or predetermined angle (for example, the reflection angle θ of the reflective member 570); and at least a part of the laser beam reflected from the reflective member 570 may be irradiated to the second area 112 of the amorphous silicon layer 130. In some embodiments, the reflection angle θ of the reflective member 570 may be determined or selected such that the second area 112 is spaced apart from the first area 111. For example, a position of the second area 112 (e.g., relative to the first area 111) may be determined or selected according to the reflection angle θ of the reflective member 570.

The reflective member 570 may be formed using a material capable of reflecting a laser beam, such as a metal, an alloy, or a mirror. For example, the reflective member 570 may include Au, Ag, Al, W, Cu, Pt, Ni, Ti, Pd, Mg, Ca, Li, Cr, Ta, Mo, Sc, Nd, Ir, an alloy containing aluminum, AlN, an alloy containing silver, WN, an alloy containing copper, an alloy containing molybdenum, TiN, CrN, TaN, SrRuO, ZnO, ITO, SnO, InO, GaO, IZO, and/or the like.

While the stage 300 moves, a second dehydrogenation process may be performed through the laser beam LB3 irradiated to the second area 112, and then the crystallization process may be performed through the laser beam LB1 irradiated to the first area 111. The hydrogen content in the amorphous silicon layer 130 may be lowered below a set or predetermined level through the second dehydrogenation process.

The laser beam emitted from the laser generator 500 and irradiated to the first area 111 of the amorphous silicon layer 130 is defined as an incident beam LB1. The laser beam reflected from the first area 111 of the amorphous silicon layer 130 and incident to the reflective member 570 is defined as a reflective beam LB2. The laser beam reflected from the reflective member 570 and irradiated to the second area 112 of the amorphous silicon layer 130 is defined as a re-incident beam LB3. The second area 112 may be spaced apart from the first area 111 by a set or predetermined distance (for example, a set or predetermined distance D) in a second direction D2 opposite to the first direction D1. Further, the second dehydrogenation process may be performed on the amorphous silicon layer 130 by using the re-incident beam LB3, and the crystallization process may be performed by using the incident beam LB1.

As shown in FIGS. 7 and 8, the incident beam LB1 may be irradiated to the first area 111 of the amorphous silicon layer 130 while the stage 300 is moving at a set or predetermined speed. The incident beam LB1 may be irradiated at an angle smaller than 90 degrees with respect to the top surface of the stage 300, and may be irradiated in a form of a line having a set or constant width and length.

In some embodiments, the re-incident beam LB3 may be irradiated to the second area 112 of the amorphous silicon layer 130 while the stage 300 moving at the set or predetermined speed. The re-incident beam LB3 may be irradiated at an angle greater than 90 degrees with respect to the top surface of the stage 300, and the incident beam LB1 and the re-incident beam LB3 may intersect or cross each other. The re-incident beam LB3 may be irradiated in a form of a line having a set or constant width and length. An incident angle of the re-incident beam LB3 may be adjusted by the reflection angle θ of the reflective member 570. By adjusting the reflection angle θ of the reflective member 570, the second area 112 to which the re-incident beam LB3 is irradiated in the second direction D2 may be spaced apart from the first area 111 to which the incident beam LB1 is irradiated on the amorphous silicon layer 130.

As shown in FIG. 5, the incident beam LB1 may have a first energy E1, and the re-incident beam LB3 may have a second energy E2, where the first energy E1 may be greater than the second energy E2. The first energy E1 may correspond to an energy level capable of changing the amorphous silicon layer 130 into a poly silicon layer, and the second energy E2 may correspond to an energy level capable of reducing the content of hydrogen contained in the amorphous silicon layer 130. For example, the first energy E1 may have a relatively high energy level so as to be used in the crystallization process, and the second energy E2 may have a relatively low energy level so as to be used in the dehydrogenation process. In some embodiments, the incident beam LB1 may be spaced apart from the re-incident beam LB3 by the set or predetermined distance D.

In the thin film crystallization method of the laser annealing device according to example embodiments of the present disclosure, hydrogen contained in the amorphous silicon layer 130 may be discharged to the outside through the first dehydrogenation process, and hydrogen contained in the buffer layer 105 may be diffused into the amorphous silicon layer 130 in the first dehydrogenation process. After the first dehydrogenation process is performed, and while the stage 300 moves in the first direction D1 at the set or predetermined speed, the second dehydrogenation process may be performed on the first portion of the amorphous silicon layer 130 through the re-incident beam LB3, and then the crystallization process may be performed on the first portion through the incident beam LB1. For example, the re-incident beam LB3 may partially discharge the diffused hydrogen to the outside of the amorphous silicon layer 130 through the second dehydrogenation process, and the hydrogen content contained in the amorphous silicon layer 130 may be lowered below a set or predetermined level. After the re-incident beam LB3 is irradiated to the first portion of the amorphous silicon layer 130, the stage 300 may move in the first direction D1 by the set or predetermined distance D, and thus the incident beam LB1 may be irradiated onto the first portion after the temperature of the first portion has recovered to room temperature. In this case, film burst may not occur in the first portion, and the first portion may be suitably crystallized. Accordingly, after the second dehydrogenation process is performed on the amorphous silicon layer 130, the crystallization process is performed, so that the amorphous silicon layer 130 may be changed into the poly silicon layer without film burst.

The present disclosure may be applied to various electronic devices, including a display device manufactured with the laser annealing device. For example, the present disclosure may be applied to a vehicle-display device, a ship-display device, an aircraft-display device, portable communication devices, display devices for display or for information transfer, a medical-display device, etc.

The foregoing is illustrative of example embodiments and is not to be construed as being limiting thereto. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure, as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and equivalents thereof.

What is claimed is:

1. A laser annealing device comprising:
    a stage to support a substrate with a thin film to be processed formed thereon, and to be moved in a first direction at a set speed;
    a laser generator to irradiate a first area of the thin film with a laser beam while the stage is moved; and
    a reflective member to reflect a part of the laser beam, which is reflected from the first area of the thin film, to a second area of the thin film,
    wherein the first area and the second area are spaced apart from each other by a set distance in a second direction opposite to the first direction.

2. The laser annealing device of claim 1, wherein a reflection angle of the reflective member is determined such that the first area and the second area are spaced apart from each other.

3. The laser annealing device of claim 1, wherein a part of the laser beam emitted from the laser generator is absorbed in the first area, and a remainder of the laser beam is reflected from the first area and then incident to the reflective member.

4. The laser annealing device of claim 1, wherein the laser beam irradiated to the first area is higher in energy than the laser beam irradiated to the second area.

5. The laser annealing device of claim 1, wherein the laser beam irradiated to the first area is an incident beam, the laser beam reflected from the first area among the incident beam is a reflected beam, and a laser beam reflected from the reflective member in the reflected beam and irradiated to the second area is a re-incident beam.

6. The laser annealing device according to claim 5, wherein a distance between the incident beam and the re-incident beam on the thin film is determined by the following expression:

$$D > vt \qquad \text{[Expression]}$$

wherein D is a distance between an incident beam and the re-incident beam, v is the set speed of the stage, and t is a time in which a temperature of the thin film recovers to room temperature after being irradiated by the re-incident beam).

7. The laser annealing device of claim 6, wherein a reflection angle of the reflective member is determined according to the distance D between the incident beam and the re-incident beam on the thin film.

8. The laser annealing device according to claim 5, wherein a crystallization process is performed on the thin film through the incident beam, and a dehydrogenation process is performed on the thin film through the re-incident beam.

9. The laser annealing device of claim 8, wherein while the stage is moved and after the dehydrogenation process is performed on the thin film, the crystallization process is performed.

10. The laser annealing device according to claim 5, wherein the incident beam is irradiated at an angle smaller than 90 degrees with respect to a top surface of the stage, and the re-incident beam is irradiated at an angle greater than 90 degrees with respect to the top surface of the stage.

11. The laser annealing device of claim 10, wherein the incident beam and the re-incident beam cross each other.

12. The laser annealing device of claim 1, further comprising at least one insulating layer between the substrate and the thin film.

13. A thin film crystallization method using a laser annealing device, the method comprising:
positioning a substrate on a stage, the substrate being with a thin film to be processed formed thereon;
moving the stage in a first direction at a set or predetermined speed;
irradiating a first area of the thin film with a laser beam; and
reflecting a part of the laser beam, which is reflected from the first area of the thin film, to a second area of the thin film,
wherein, while the stage is moved, a crystallization process is performed through the laser beam irradiated to the first area after a dehydrogenation process is performed through the part of the laser beam irradiated to the second area, and
the first area and the second area are spaced apart from each other by a set distance in a second direction opposite to the first direction.

14. The method of claim 13, wherein the laser beam irradiated to the first area is an incident beam, the laser beam reflected from the first area among the incident beam is a reflected beam, and a laser beam irradiated to the second area after being reflected from a reflective member is a re-incident beam, and
wherein the incident beam is irradiated at an angle smaller than 90 degrees with respect to a top surface of the stage, the re-incident beam is irradiated at an angle greater than 90 degrees with respect to the top surface of the stage, and the incident beam and the re-incident beam cross each other.

15. The method of claim 14, wherein a crystallization process is performed on the thin film through the incident beam, and a dehydrogenation process is performed on the thin film through the re-incident beam.

16. The method of claim 13, wherein a part of the laser beam is absorbed in the first area, and a remainder of the laser beam is reflected from the first area.

17. The method of claim 13, wherein the laser beam irradiated to the first area is higher in energy than the laser beam irradiated to the second area.

18. The method of claim 13, further comprising:
forming at least one insulating layer between the substrate and the thin film,
wherein the insulating layer includes silicon oxide, silicon nitride, silicon oxynitride, silicon oxycarbide, silicon carbonitride, aluminum oxide, aluminum nitride, tantalum oxide, hafnium oxide, zirconium oxide, and/or titanium oxide, and the thin film includes an amorphous silicon layer.

* * * * *